(12) United States Patent
Anbuky et al.

(10) Patent No.: US 7,199,557 B2
(45) Date of Patent: Apr. 3, 2007

(54) APPARATUS, METHODS AND COMPUTER PROGRAM PRODUCTS FOR ESTIMATION OF BATTERY RESERVE LIFE USING ADAPTIVELY MODIFIED STATE OF HEALTH INDICATOR-BASED RESERVE LIFE MODELS

(75) Inventors: Adnan H. Anbuky, Christchurch (NZ); Phillip E. Pascoe, Christchurch (NZ)

(73) Assignee: Eaton Power Quality Company, Christchurch (NZ)

( * ) Notice: Subject to any disclaimer, the term of this patent is extended or adjusted under 35 U.S.C. 154(b) by 397 days.

(21) Appl. No.: 10/611,650

(22) Filed: Jul. 1, 2003

(65) Prior Publication Data
US 2005/0001627 A1    Jan. 6, 2005

(51) Int. Cl.
H01M 10/44    (2006.01)
H01M 10/46    (2006.01)

(52) U.S. Cl. .................................... 320/132

(58) Field of Classification Search ........ 320/132–136, 320/DIG. 21; 324/426, 430, 431, 432, 433
See application file for complete search history.

(56) References Cited

U.S. PATENT DOCUMENTS

| | | | |
|---|---|---|---|
| 4,876,513 A | 10/1989 | Brilmyer et al. | 324/427 |
| 4,952,862 A | 8/1990 | Biagetti et al. | 320/48 |
| 5,130,659 A | 7/1992 | Sloan | 324/435 |
| 5,371,682 A | 12/1994 | Levine et al. | 364/483 |
| 5,587,660 A | 12/1996 | Chabbert et al. | 324/426 |
| 5,587,924 A | 12/1996 | Rossi | 364/496 |
| 5,619,417 A | 4/1997 | Kendall | 364/483 |
| 5,663,626 A | 9/1997 | D'Angelo et al. | 318/799 |
| 5,705,929 A * | 1/1998 | Caravello et al. | 324/430 |
| 5,773,962 A | 6/1998 | Nor | 320/134 |
| 5,786,640 A | 7/1998 | Sakai et al. | 290/17 |
| 5,822,495 A | 10/1998 | Wang et al. | 395/3 |
| 5,825,156 A | 10/1998 | Patillon et al. | 320/21 |
| 6,064,180 A | 5/2000 | Sullivan et al. | 320/132 |
| 6,104,967 A | 8/2000 | Hagen et al. | 700/293 |
| 6,255,801 B1 | 7/2001 | Chalasani | 320/132 |
| 6,456,988 B1 | 9/2002 | Singh et al. | |
| 6,515,454 B2 | 2/2003 | Schoch | |
| 6,532,425 B1 * | 3/2003 | Boost et al. | 324/431 |
| 6,850,038 B2 * | 2/2005 | Arai et al. | 320/132 |
| 6,885,951 B2 * | 4/2005 | Richter | 702/63 |

FOREIGN PATENT DOCUMENTS

| | | |
|---|---|---|
| EP | 0 714 033 | 5/1996 |
| FR | 2 734 061 | 11/1996 |
| WO | WO96/15563 | 5/1996 |
| WO | WO98/32181 | 7/1998 |
| WO | WO98/40951 | 9/1998 |
| WO | WO99/27628 | 6/1999 |
| WO | WO99/34224 | 7/1999 |
| WO | WO 01/51947 A1 | 7/2001 |

OTHER PUBLICATIONS

International Search Report, PCT/NZ2004/000135, Sep. 3, 2004.
"IEEE Recommended Practice for Maintenance, Testing, and Replacement of Valve-Regulated Lead-Acid (VRLA) Batteries for Stationary Applications," IEEE Std 1188-1996, 16 pages.
Alber et al., "Impedance Testing—Is it a Substitute for Capacity Testing," INTELEC 1994, 10-1, pp. 245-249.
Anbuky et al., "Knowledge Based VRLA Battery Monitoring and Health Assessment," IEEE, 2000, pp. 687-694.
Cun et al., "The Experience of a UPS Company in Advanced Battery Monitoring," INTELEC 1996, 22-5, pp. 646-653.
International Search Report, PCT/NZ01/00183, Jul. 23, 2002.
International Search Report, PCT/NZ01/00182, May 29, 2002.
Konya et al., "A Deterioration Estimating System for 200-Ah Sealed Lead-Acid Batteries," 1994 IEEE, pp. 256-262.
Kurisawa et al., "Capacity Estimating Method of Lead-Acid Battery by Short-time Discharge," INTELEC 1997, pp. 493-490.
Kurisawa et al., "Internal Resistance and Deterioration of VRLA Battery Analysis of Internal Resistance Obtained by Direct Current Measurement and its Application to VRLA Battery Monitoring Technique," INTELEC 1997, 29-3, pp. 687-694.
Markle, Gary J., "AC Impedance Testing for Valve Regulated cell," INTELEC 1992, 9-4, pp. 212-217.
Ng et al., "Evaluation of a Reverse Time Prediction Algorithm for Lead Acid Battery," INTELEC 1996, pp. 616-623.
Pascoe et al., "Estimation of VRLA Battery Capacity Using The Analysis of The Coup De Fouet Region," 1999 IEEE, 9 pages.
Pascoe et al., "VRLA Battery Capacity Measurement and Discharge Reserve Time Prediction," 1998 IEEE, pp. 302-310.
Suntio et al., "The Batteries as a Principal Component in DC UPS Systems," IEEE, 1990, pp. 400-411.
Supplementary European Search Report, EP 99 94 0753, Jun. 25, 2002.

(Continued)

*Primary Examiner*—Edward H. Tso
(74) *Attorney, Agent, or Firm*—Myers Bigel Sibley & Sajovec PA

(57) ABSTRACT

A model of battery reserve life that a function of a SOH indicator is adaptively modified responsive to intermittent capacity tests of a battery, e.g., based on reserve life estimates generated responsive to the capacity tests. The SOH indicator for the battery is monitored to generate SOH indicator values, and estimates of reserve life are generated from the generated SOH indicator values according to the adaptively modified model of reserve life. For example, a capacity test may be performed responsive to detection of a change in reserve life as estimated by the model of reserve life, and the model of reserve life may be modified responsive to the capacity test. The battery reserve life model may, for example, express reserve life as a function of a float voltage, a float current, a temperature, a charge/discharge cycling, an impedance, a conductance, a resistance, and/or a coup de fouet parameter. The invention may be embodied as methods, apparatus and computer program products.

21 Claims, 13 Drawing Sheets

OTHER PUBLICATIONS

Troy et al., "Midpoint Conductance Technology Used in Telecommunication Stationary Standby Battery Applications, Part VI, Considerations for Deployment of Midpoint Conductance in Telecommunications Power Applications," INTELEC 1997, 29-4, pp. 695-702.

Yamamoto et al., "Deterioration Estimation Method for 200-Ah Sealed Lead Batteries," NTT Review, vol. 7, No. 4, Jul. 1995, pp. 65-69.

Yamashita et al., "A New Battery Check System in Telecommunications Power Plants," NTT Review, vol. 9, No. 3, May 1997, pp. 131-135.

* cited by examiner

APPARATUS, METHODS AND COMPUTER PROGRAM PRODUCTS FOR ESTIMATION OF BATTERY RESERVE LIFE USING ADAPTIVELY MODIFIED STATE OF HEALTH INDICATOR-BASED RESERVE LIFE MODELS

BACKGROUND OF THE INVENTION

The present invention relates to battery monitoring, and more particularly, to methods, apparatus and program products for estimating battery reserve life.

The valve regulated lead acid (VRLA) battery is used extensively throughout the telecommunications industry as a backup energy storage source. Typically, the battery is the only backup energy source in such applications and, thus, the last line of defense against system failure in the event of AC mains failure. Due to mis-operation, manufacturing deficiencies or the lack of monitoring and maintenance, it is often the most unreliable component within the standby power system.

Battery capacity, the energy storage capability, has long been a target of researchers as a definitive battery state of health (SOH) indicator. Conventional standards, such as "IEEE Recommended Practices for Maintenance, Testing and Replacement of Valve Regulated Lead Acid (VRLA) Batteries in Stationary Applications," IEEE STD 1188-1996, base criteria for determining end of battery operational life on capacity. Typically, when the capacity reaches 80% of the manufacturer's rated capacity, the battery is deemed to be at the end of its operational life.

Although much work has been conducted to develop algorithms to determine battery SOH, it appears that little work has been performed to develop techniques for estimating battery reserve life. The ability to determine that a battery is not able to perform as required has obvious advantages. However, this information often comes too late, such that system performance may be jeopardized and may remain that way until the old battery can be replaced, which may take many weeks. Accordingly, there is a need for effective techniques for predicting battery reserve life.

SUMMARY OF THE INVENTION

According to some embodiments of the invention, estimation of reserve life of a battery may be achieved. A model of battery reserve life that a function of a SOH indicator is adaptively modified responsive to intermittent capacity tests of the battery, e.g., based on reserve life estimates generated responsive to the capacity tests. The SOH indicator for the battery is monitored to generate SOH indicator values, and estimates of reserve life are generated from the generated SOH indicator values according to the adaptively modified model of reserve life. For example, a capacity test may be performed responsive to detection of a change in reserve life as estimated by the model of reserve life, and the model of reserve life may be modified responsive to the capacity test. The battery reserve life model may, for example, express reserve life as a function of a float voltage, a float current, a temperature, a charge/discharge cycling, an impedance, a conductance, a resistance, and/or a coup de fouet parameter. The battery reserve life estimates may be presented for use by, for example, a control and/or monitoring system. The invention may be embodied as methods, apparatus and computer program products.

DETAILED DESCRIPTION OF EMBODIMENTS

Figure 1A:
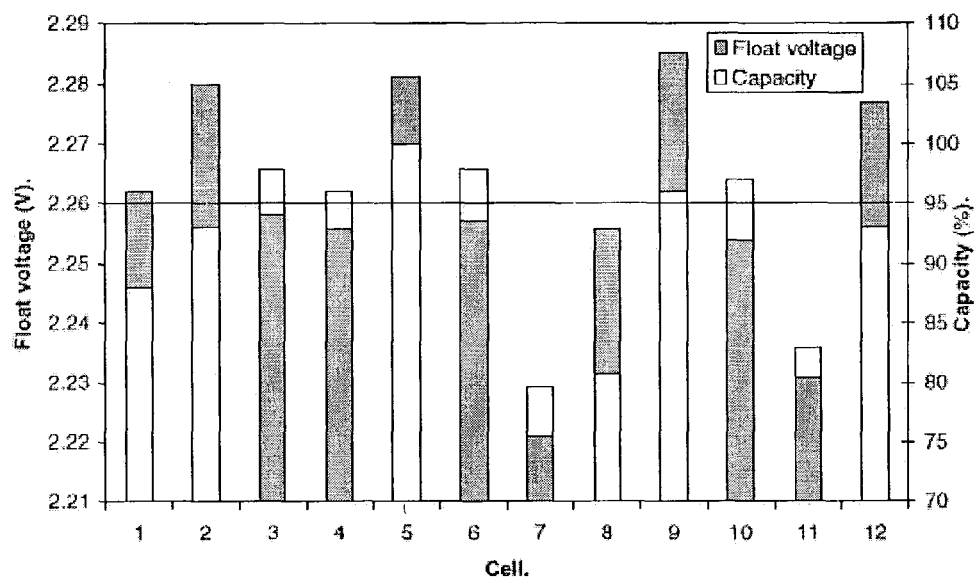
FIGS. 1A and 1B are graphs illustrating float voltage and capacity relationships for a battery.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present.

The present invention may be embodied as apparatus (systems), methods, and/or articles of manufacture, including computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

The present invention is described herein with reference to flowchart and/or block diagram illustrations of methods, systems, computer data signals and computer program products in accordance with exemplary embodiments of the invention. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

In the following discussion, operations for estimating life reserve of a valve-regulated lead-acid (VRLA) battery according to some embodiments of the invention are described. It will be appreciated that these operations are described for illustrative purposes, and that the invention is not limited to VRLA batteries or the specific operations shown.

Overview

As stated previously, conventional criteria for determining the end of battery operational life are typically based on battery capacity. It follows that by tracking the trend in capacity, remaining life could be estimated. Embodiments of the invention arise from a realization that, rather than conducting discharge (capacity) tests throughout the entire life of the battery, it may be advantageous to employ a less intrusive approach for detecting whether battery capacity (or SOH) has changed.

The efficacy of a number of SOH indicators will now be discussed. The reliability of the SOH information provided by each varies and is generally dependent upon the battery type, battery operating conditions employed, battery failure mechanism occurring and the acquisition accuracy.

Float voltage is relatively easy to acquire but may provide a low to medium level of reliability. Constant voltage charging is typically employed in backup power applications, so neither the battery or string voltage tends to reflect battery state of charge (SOC) or SOH information in such applications. Furthermore, it has been reported that there is no significant correlation between float voltage of individual battery units and SOH. See M. J. Hlavac, D. O. Feder, T. G. Croda, and K. S. Champlin, "Field and Laboratory Studies to Assess the State of Health of Valve Regulated Lead Acid and Other Battery Technologies: Using Conductance Testing: Part II of INTELEC Series: Further Conductance/Capacity Correlation Studies," INTELEC 1993, Paris, France, S.36.B. Float voltage may also be unreliable for indicating SOH because the relationship between the float voltage and SOH may be ambiguous.

Figure 1B:
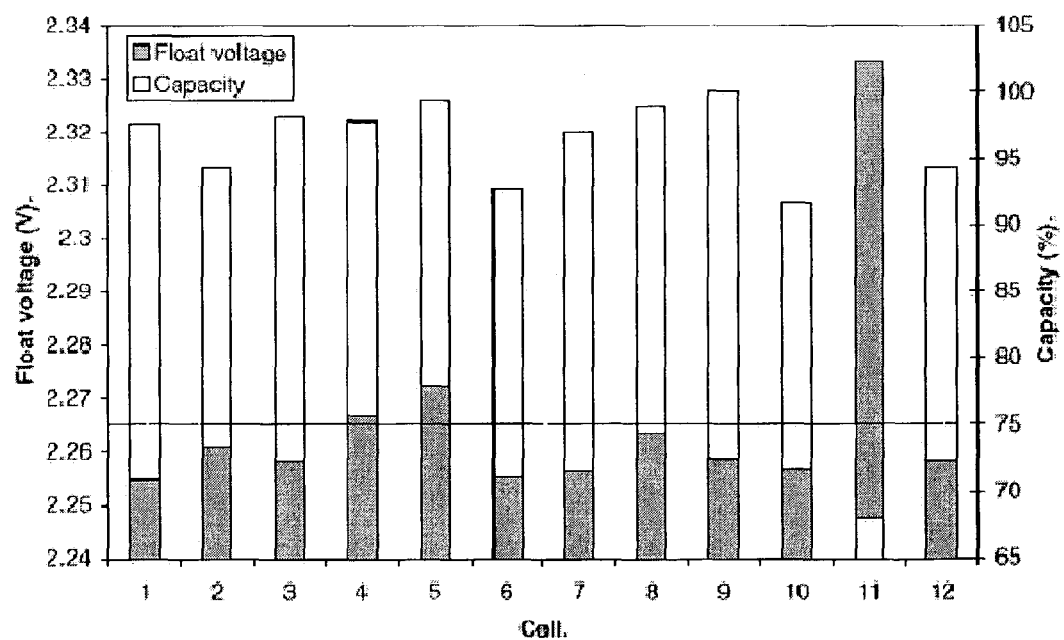

FIGS. 1A and 1B illustrate two situations, where both low (FIG. 1A) and high (FIG. 1B) float voltages coincide with poor SOH (low capacity). In both cases, twelve 2V cells are on float charge before being discharged. The capacity is given as a percentage of the maximum cell capacity.

Figure 2:
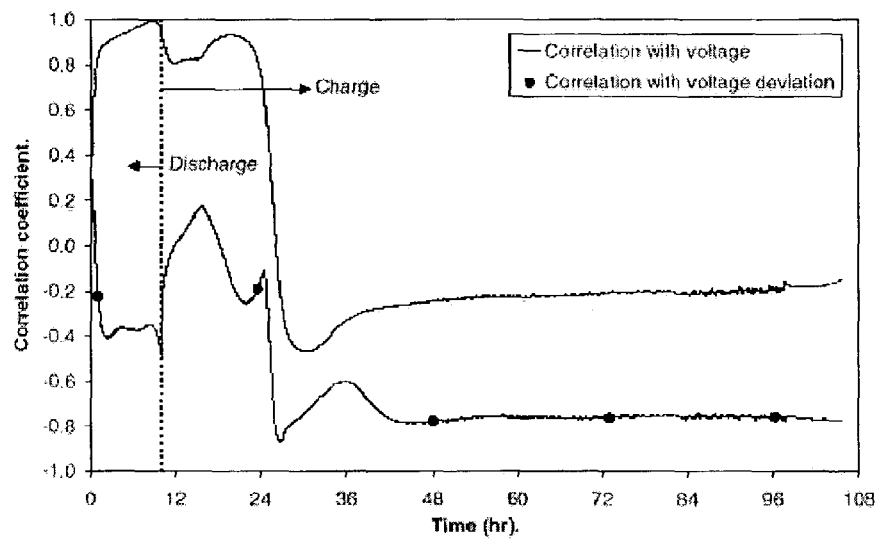
FIG. 2 is a graph illustrating correlation of cell voltage and capacity for a battery.

FIGS. 1A and 1B do demonstrate that extreme battery unit float voltages may indicate poor SOH. Thus, a potential solution is to track the absolute deviation of the battery unit float voltage from the average battery unit float voltage. An example is given in FIG. 2, where the trend in correlation coefficient between cell capacity and cell voltage and capacity and the cell's absolute voltage deviation from the average cell voltage is given. As expected, the capacity appears inversely proportional to absolute voltage deviation during float. It has also been suggested that tracking the trend of float voltage spread of battery units over time can indicate battery SOH. See A. I. Harrison, and P. D. Taylor, "Valve-Regulated Lead/Acid Battery Condition Monitoring," INTELEC 1993, Paris, France, S.39.P. Float voltage spread is the difference between the maximum and minimum battery unit float voltage.

Figure 3:
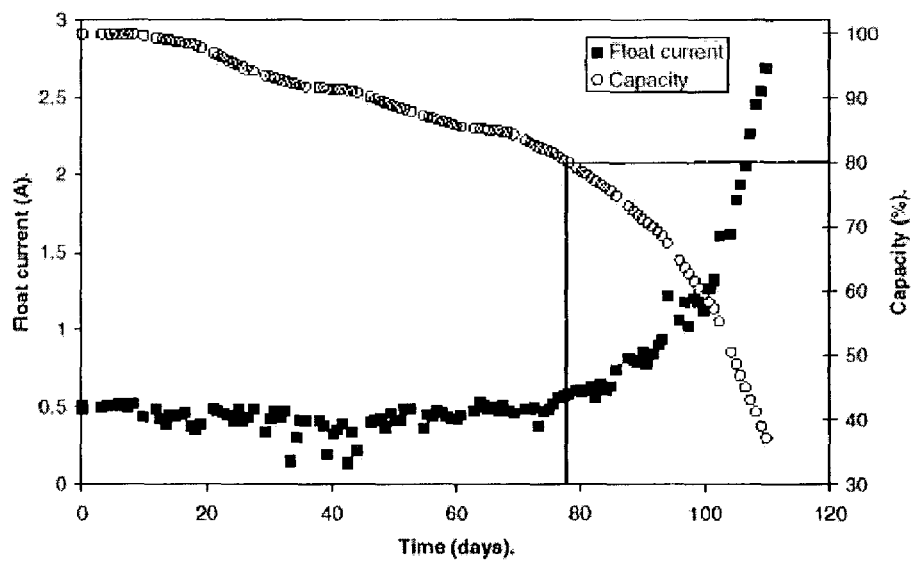
FIG. 3 is a graph illustrating float current and capacity trends during aging of a battery.

Float current has been reported to increase toward the end of life. See K. D. Floyd, Z. Noworolski, J. M. Noworolski, and W. Sokolski, "Assessment of Lead-Acid Battery State of Charge by Monitoring Float Charging Current," INTELEC 1994, Vancouver, B. C., Canada, P20-2; W. R. Plow and D. B. Garrett, "Float Current Monitoring and Evaluation," INTFLEC 2000, Phoenix, Ariz., USA, P19-1. FIG. 3 illustrates the float current during accelerated thermal aging of a 12V mono-bloc. Also given is the trend in capacity. The float current begins to increase at approximately the 75th day. At this stage, the capacity has fallen to approximately 80%.

SOH information, however, may be difficult to extract from float current. The magnitude of the float current typically is very low and, therefore, may be difficult to measure using the same device used for measuring discharge current. As a result, specialized current transducers have been developed. The float current can also vary to a greater extent due to temperature variation than due to battery SOH. Furthermore, the behavior of the float current typically varies from battery to battery and typically depends upon the failure mode occurring.

Temperature may significantly affect the operational life of a standby VRLA battery. A rule of thumb derived from Arrhenius' equation is that for every 10° C. rise in temperature, the operational life of the battery is reduced by half. It follows that tracking the temperature rise of a battery may provide state of health information. See J. Bizouard, V. Schneider, and M. Boost, "A Battery Node for Power Plant Monitoring Systems," INTELEC 1998, San Francisco, USA, P27-1. This technique may have a low to medium reliability, as the rise in temperature tends to be very small compared to the corresponding reduction in SOH, often rising only after the SOH has decreased dramatically.

Figure 4A:
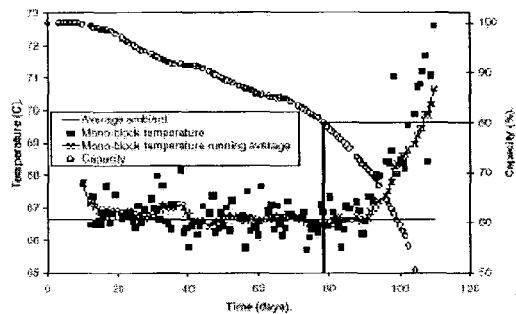
FIGS. 4A–4D are graphs illustrating temperature, capacity and reserve life during aging of a battery.

FIG. 4A illustrates the cell temperature trend of a 12V mono-bloc as it undergoes accelerated thermal ageing. Also included is a 7-day running average of the temperature, the average ambient temperature and the trend in battery capacity. It can be seen that the temperature of the mono-bloc begins to rise significantly at approximately 90 days into the test, coinciding with a drop in capacity to approximately 70%. The increase in battery temperature may reflect an increase in float current that also occurs at this time (see FIG. 3). In comparison to float current, though, battery temperature may be easier to measure. However, the change in battery temperature may be as difficult to detect as the change in float current if the ambient temperature is not constant.

Figure 4B:
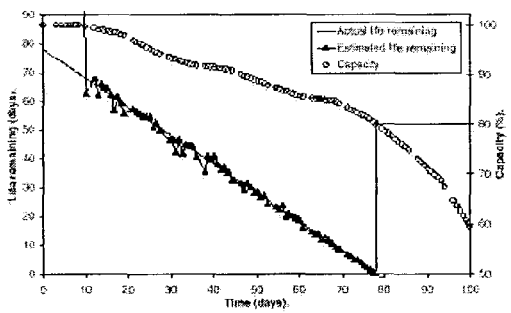
Figure 4C:
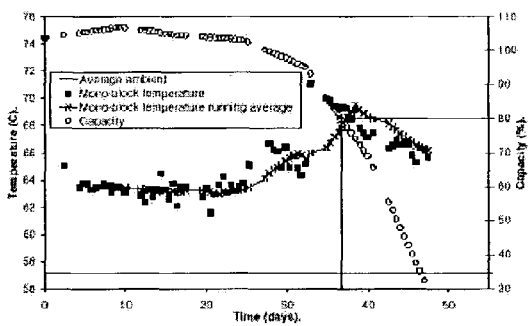

FIG. 4C illustrates the temperature and capacity trend data for another 12V mono-bloc of the same type. In this case, the temperature begins to rise approximately 28 days into the test. This coincides with a capacity of 99%. The temperature keeps rising until the capacity has fallen to approximately 75%, at which time it begins to decrease. These ambiguous results provide an indication of a potential difficulty of using battery temperature alone to assess SOH.

In addition to temperature trending, information can be derived from comparing the instantaneous temperature of battery units within the battery. It has been recommended that a temperature difference between cells of 3° C. as a threshold for indicating the possibility of cell failure. An alternative to tracking the temperature rise over time is to calculate the accumulated thermal stress. Using Arrhenius' equation as a basis, equation (1) can be derived for obtaining the reserve life of a battery operated at any ambient temperature:

$$L_R(t_x) = \frac{L_n - \sum_{i=1}^{x}(t_i - t_{i-1}) \cdot 2^{\frac{(T_i-T_n)}{\alpha}}}{2^{\frac{(T_x-T_n)}{\alpha}}}. \quad (1)$$

$L_R$ is the remaining life at time period $t_x$, at the present ambient temperature $T_x$, and $L_n$ is the manufacturer's designed life at the nominal temperature $T_n$. The difference in consecutive time periods, $(t_i-t_{i-1})$, may be taken to be a day. Typically, the designed life is 10 years and the nominal temperature is 20 or 25° C. Temperature, $T_i$, is the average temperature during the time period $t_i$. $\alpha$ is the change in temperature that results in the life of the battery changing by a factor of two. A rule of thumb defines $\alpha$ to be equal to 10° C. However, for the test of FIG. 4A, the appropriate value of $\alpha$ was found to be 8.2° C.

Figure 4D:
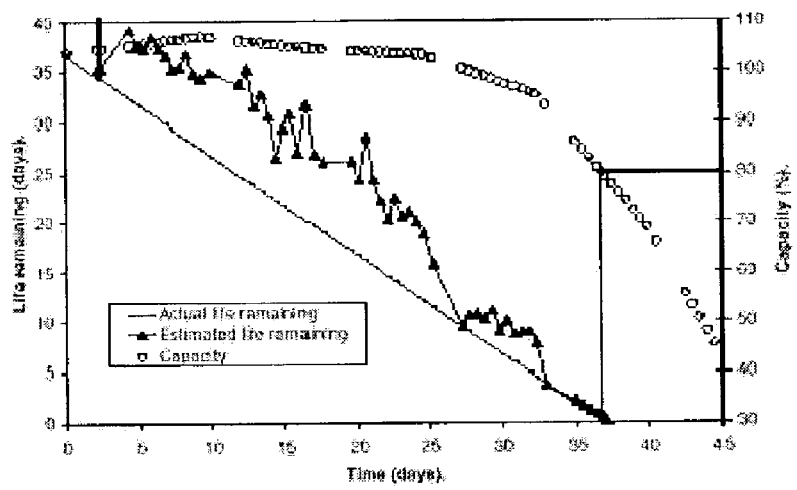

The actual and estimated reserve life (using equation (1)) is illustrated in FIG. 4B. The corresponding actual and estimated life remaining using equation (1) for the mono-bloc of FIG. 4C is given in FIG. 4D, along with the trend in capacity. In this case, the appropriate value of $\alpha$ was found to be 6.8° C. The reason for the different values of $\alpha$ may be attributed to the use of dissimilar operating conditions during each test, that is, the conduction of a different number and depth of discharges at different rates, which also may influence battery health. Furthermore, the effect of using a higher float voltage than is appropriate at this ambient temperature (as part of a thermal accelerated ageing process) has not been considered. These issues again highlight the difficulty of employing temperature to obtain SOH information.

The number of charge/discharge cycles can also provide SOH information. Manufacturers typically specify the number and depth of discharges a battery is capable of delivering throughout its lifetime. Despite this, it is often difficult to determine the reserve life based on this information alone, as the influence of other operating conditions, such as float voltage and temperature, need to be considered. In addition, standby power system applications generally are not what would be considered typical cyclic applications, as, typically, relatively infrequent use of the battery occurs during battery lifetime.

In the event that a discharge does occur, there are techniques available which can utilize the resulting data more effectively to assess SOH. That is, coup de fouet information, as described in P. E. Pascoe and A. H. Anbuky, "The behaviour of the coup de fouet of VRLA batteries," *The Journal of Power Sources*, Vol. 111, Issue 2, pp. 306–321, 2002, can be used to obtain a direct indication of SOH.

A potential disadvantage of impedance, conductance and resistance techniques for determining SOH is that specialized test equipment may be required. There is also debate regarding the effectiveness of these techniques and over which technique provides the most reliable SOH information, as discussed in M. J. Hlavac and D. Feder, "VRLA Battery Conductance Monitoring, Part V: Strategies for VRLA Battery Testing and Monitoring in Telecom Operating Environment," INTELEC 1996, Boston, USA, P22-3, and Z. Noworolski, and U. Reskov, "(Can a Battery Ohmic Tester Distinguish a Good Cell From the Pool of Better Ones?," INTELEC 2002, Montreal, Canada, P14-3. For some conventional impedance and conductance techniques, the choice of test frequency can influence the measurement. Ultimately, SOH degradation may be detectable only for certain failure modes or only after significant SOH degradation. Thus, the reliability of these techniques may be reduced.

Figure 5:
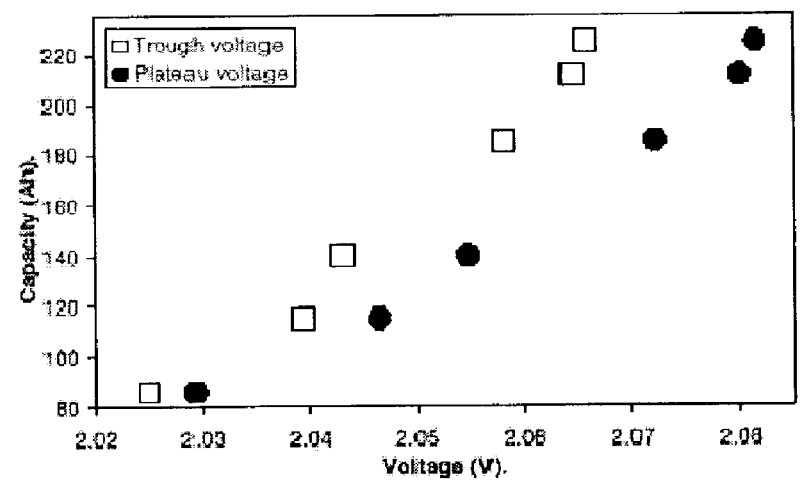
FIG. 5 is a graph illustrating coup de fouet voltage and capacity relationships for a battery.

Coup de fouet based techniques can be complex to implement, but have been shown to be reliable for detecting a change in SOH. The coup de fouet's trough and plateau voltage parameters are close to linearly related to capacity, as illustrated in FIG. 5, which shows trough and plateau voltages versus the capacity of a number of thermally aged 2V cells.

Figure 6:
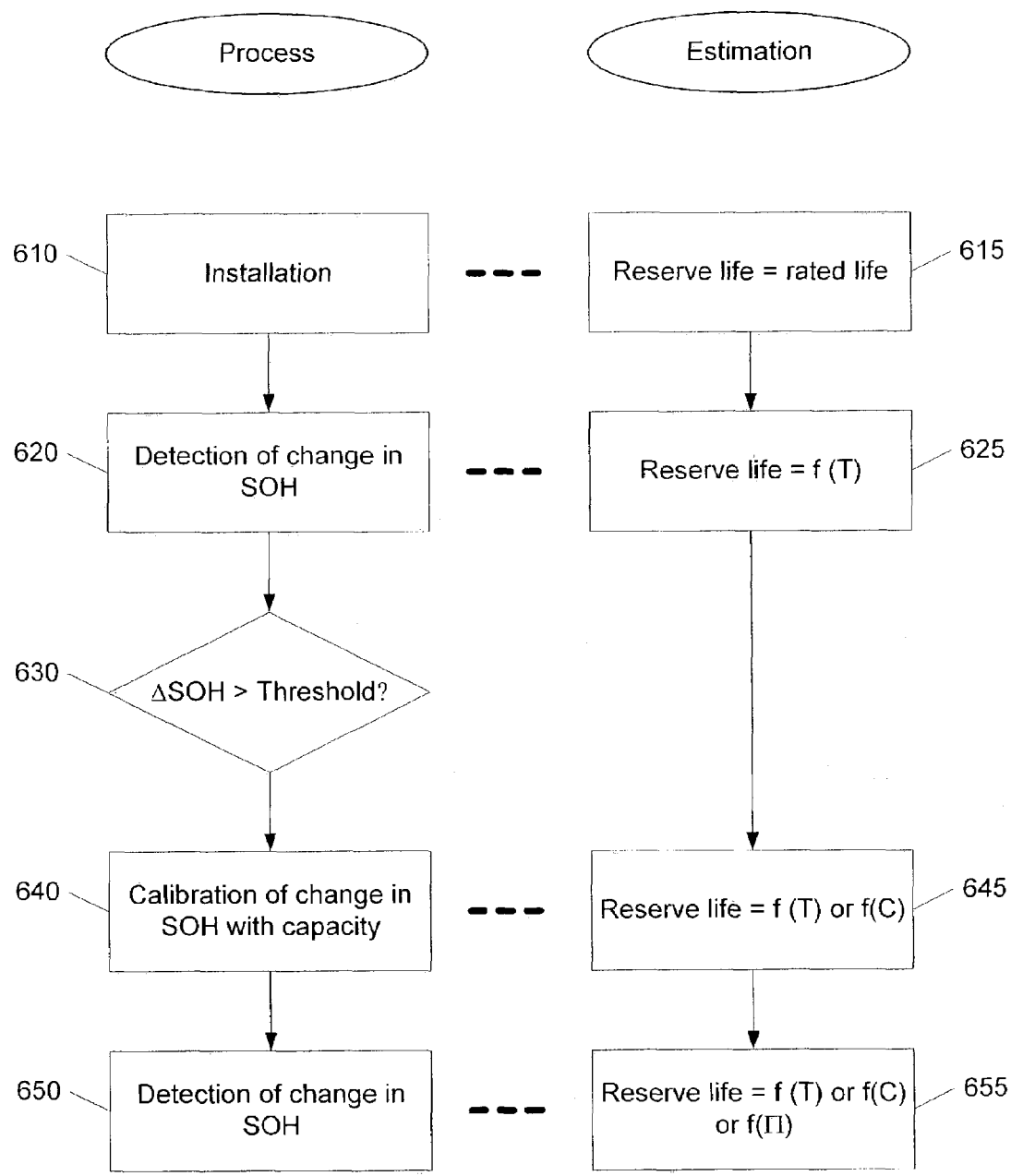
FIG. 6 is a flowchart illustrating exemplary operations for battery reserve life estimation according to some embodiments of the invention.

Exemplary battery reserve operational life estimation operations according to some embodiments of the invention are illustrated in FIG. 6. In the illustrated embodiments, reserve life estimation is iterative and includes a series of stages over battery life. Referring to FIG. 6, a battery is installed and initialized (Block 610). For example, the battery may be first discharged. The discharge may not be at the system discharge (load) rate and/or may not end at the system end voltage. If it is performed, and depending on the operating conditions employed, the discharge may be used to benchmark the capacity of the battery. At this initialization stage, it may be that the best estimate of reserve life that can be made is that it is equal to the manufacturer's rated life at the ambient temperature (Block 615). This is unlikely to be very accurate, as the battery's health may not be affected in the way the manufacturer envisioned. It may, for example, suffer from a manufacturing defect and/or be operated in an extreme (or incorrect) manner. Accordingly, training tests may be conducted to generate the initial estimate of life. For example, very shallow discharges may be used if a coup de fouet base model is employed to detect a change in SOH and if operating conditions are variable. The duration and extent of training may depend upon the battery operating conditions. If operating conditions, specifically the ambient temperature, are harsh, then training preferably is completed reasonably quickly, before battery SOH begins to degrade significantly. If the operating conditions are highly variable, then many tests may be needed to accurately represent the behavior of the coup de fouet.

Battery health may then be indirectly detected (Block 620) through the tracking of one (or more) SOH indicators, such as the SOH indicators discussed above. For example, at this stage, estimation of reserve operational life may be based on thermal accumulation. In such a case, equation (2) may be used to give the estimation of reserve life:

$$L_R(t_x) = f(T) = \beta \cdot \left[ \frac{L_n - \sum_{i=1}^{x}(t_i - t_{i-1}) \cdot 2^{\frac{(T_i-T_n)}{\alpha}}}{2^{\frac{(T_x-T_n)}{\alpha}}} \right]. \qquad (2)$$

It will be noted that equation (2) resembles equation (1), but includes an additional factor β. This factor allows the detrimental effects caused by the use of an inappropriate float voltage and/or the conduction of charge-discharge cycles to be taken into account. For example, α may be initially set to 10 and β may be set to 1. It is important to note that if there is a change in the operating conditions driving the failure mode responsible for the degradation of battery SOH, then the reserve operational life and, consequently, the estimation of reserve operational life, may change. This is analogous to reserve time in that, if the operating conditions (discharge rate) change, the reserve time will typically change. During this monitoring period, the reserve life may be identified from the SOH-indicator-based model (e.g., equation (2)) for purposes such as preventive maintenance, power system control, and the like (Block 625).

At some point, a significant change in battery SOH, is detected (Block 630). A check of battery capacity is then conducted (Block 640) using, for example, a partial discharge of the battery and a discharge voltage versus reserve charge model. An example of such a model that may be used with the invention is described in A. H. Anbuky and P. E. Pascoe, "VRLA Battery State of Charge Estimation in Telecommunication Power Systems", IEEE Transactions on Industrial Electronics, Vol. 47, No. 3, June 2000, pp. 565–573. If the battery capacity was known at the beginning (during initialization), then the trend in capacity can be used to estimate reserve life.

Once the battery SOH begins to decrease, the rate of decrease typically accelerates. In fact, the trend of capacity C(t) can closely resemble a logarithmic function of time t, as expressed by equation (3):

$$C(t) = \omega \log(\gamma - t). \qquad (3)$$

When the capacity C(t) has been estimated at two different times, the parameters ω and γ of equation (3) can be determined using, for example, non-linear least squares estimation technique as described in J. S. R. Jang, C. T. Sun, and E. Mizutani, *Neuro-Fuzzy and Soft Computing, A Computational Approach to Learning and Machine Intelligence*, Prentice Hall, N.J., USA, 1997. By re-arranging equation (3), an expression for the reserve life $L_R$ may be obtained:

$$L_R(t) = f(C) = \gamma - 10^{\frac{C_E}{\omega}} - t. \qquad (4)$$

Here the capacity $C_E$ is the end of life capacity and t is the elapsed lifetime. 80% of manufacturer's rated capacity, or any arbitrary value, may be used as the end of life capacity $C_E$.

If little or no degradation in capacity is detected or if the estimated reserve life given by equation (4) is greater than that given by equation (2), it is disregarded, and the last estimation based on the SOH parameter(s) is selected as the current estimate (Block 645). A reason for such a decision it that an estimation based on thermal accumulation and the manufacturers designed life is most likely to be the upper limit on battery life.

If, however, the estimation given by equation (4) indicates a diminished reserve life in comparison to the last estimate derived from the SOH parameter(s), it can be used to modify (calibrate) the SOH-indicator-based reserve life estimation model (Block, e.g., the model given by equation (2). Thus, for example, a thermal stress factor α may be found such that the reserve life estimation given by equation (2) is equal to that given by equation (4). In conjunction with this, a value may be found for the float voltage and cycling stress factor β, such that it corrects the change in estimated reserve life given by equation (2) to equal the change in elapsed operating time.

Subsequent capacity checks allow the re-identification of the parameters ω and γ, and can allow a corresponding improvement in the estimation accuracy given by equation (4). The reserve life estimation operations may be repeated a number of times (Block 650). The estimation of reserve life may be given by equation (2) between capacity checks and by equation (4) (or by equation (2)) at (or near) capacity checks (Block 655).

As the battery further deteriorates, the change in capacity, and thus the reserve life estimation, can be calibrated to the change in SOH as detected by other SOH indicators. The estimation of reserve operational life using a capacity trend model may not take into account a change in operating conditions between capacity checks and, therefore, it may be advantageous to use an SOH-indicator-based model to estimate reserve life between capacity checks, as shown with the model presented above, which reflects thermal accumulation, float voltage and cycling stress (equation (1). However, if the relationship between the SOH-indicator based model and the capacity trend model cannot be adequately expressed, inaccuracy may result. In such a case, it may be advantageous to change to a model that can detect a change in capacity without requiring a capacity check.

SOH indicators that can meet these requirements include coup de fouet parameters, e.g., trough and/or plateau voltages. The relationship between these parameters and capacity appears to be more deterministic and close to linear. Furthermore, they have been shown to be highly reliable in detecting a change in battery capacity regardless of the failure mode. By calibrating the change in capacity with the change in either the trough of plateau voltages, changes in capacity can be detected.

To demonstrate such a process, it may be assumed that the capacity of a battery decreases from $C_n$ at time $t_n$ to $C_{n+1}$ at time $t_{n+1}$, and the coup de fouet parameter (e.g., plateau or trough voltage) changes from $\Pi_n$ to $\Pi_{n+1}$ at the corresponding times. The coup de fouet parameter $\Pi_E$ corresponding to the end of life capacity $C_E$ can be found as follows:

$$\Pi_E = \Pi_{n+1} - \frac{C_{n+1} - C_E}{C_n - C_{n+1}} \cdot (\Pi_n - \Pi_{n+1}). \tag{5}$$

Reserve life can be estimated based on when the coup de fouet parameter reaches the end of life coup de fouet parameter $\Pi_E$, i.e., reserve life $L_R$ may be given by:

$$L_R(t_{x+1}) = f(\Pi) = \frac{t_{x+1} - t_x}{\Pi_{x+1} - \Pi_x} \cdot (\Pi_E - \Pi_{x+1}). \tag{6}$$

Coup de fouet parameters $\Pi_x$ and $\Pi_{x+1}$, measured at times $t_x$ and $t_{x+1}$, may be used to estimate the reserve life. Care should be taken in applying the calibration process, as benefits obtained by tracking the SOH indicator may be lost in obtaining the relationship between the SOH indicator and capacity.

The following case study illustrates an exemplary reserve life estimation process according to some embodiments of the invention. A 2V cell with a design life of 10 years is utilized. This cell was cycled under thermal accelerated ageing conditions (70° C. ambient, 2.27V float voltage). The discharge depths employed were 10% (to expose the coup de fouet), and 15% for capacity checks. Using equation (2), an estimation of reserve life was calculated. When either this or actual time changed by 11 days (approximately corresponding to 1 year at an ambient temperature of 20° C.) a capacity test was triggered. For the coup de fouet, it was observed that a change in either the trough or plateau voltage of 15–20 mV/cell corresponds to a change in capacity of 20%. Thus, the capacity check threshold based on the coup de fouet was defined to be half the lower value or 7.5 mV. The capacity of the cell was determined at the start of the test and the end of life capacity was defined to be 80% of the manufacturers rated capacity.

Training of the coup de fouet based algorithm to accommodate variations in operating conditions was performed. In this example, accelerated thermal ageing was employed, making training difficult, as the SOH of the battery began to deteriorate immediately. However, this is not a disastrous situation, as the operating conditions employed remain relatively constant (the only operating condition that varied appreciably was discharge depth).

Figure 7:
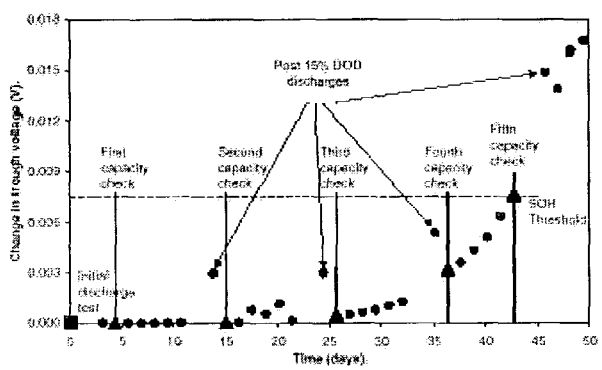
FIG. 7 is a graph illustrating change in coup de fouet parameters for a battery undergoing reserve life estimation according to some embodiments of the invention.
Figure 8A:
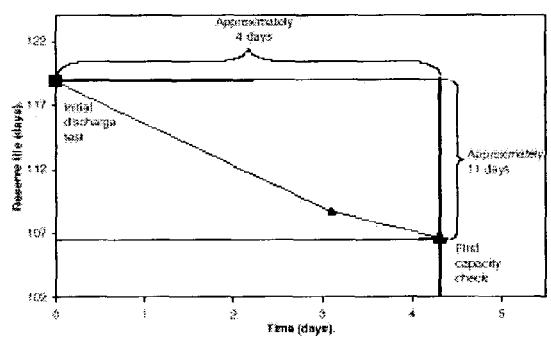
FIGS. 8A–8F are graphs illustrating modification of a temperature-based battery reserve life model according to some embodiments of the invention.

The first capacity check was activated after the estimated life remaining given by thermal accumulation (equation (2)) changed by around 11 days, as indicated in FIG. 8A. Clearly, there is inaccuracy in the reserve life estimation at this stage, as the test elapsed time was only around 4 days. During this interval, the trough voltage (see FIG. 7) did not indicate any change in battery SOH. It is believed that this was due in part to the small change in battery SOH that occurred, the stabilization of the coup de fouet to the new battery operating regime, and the harsh operating conditions, which may have initially distorted the coup de fouet behavior. Employing an adaptive version of the discharge voltage versus reserve charge estimation model and a 15% DOD (degree of discharge), an estimation of capacity was obtained. Using equation (3), along with the capacity estimation and the initial measure of capacity, the trend in capacity can be estimated. Using equation (4), with the parameters from equation (3), an estimate of the reserve life of around 119 days is obtained from the trend in capacity. This is greater than the approximately 107 days estimated using thermal accumulation. Thus, the trend incapacity does not appear to be capable of providing a better reserve life estimation, and so, at this stage, it is neglected.

Figure 8B:
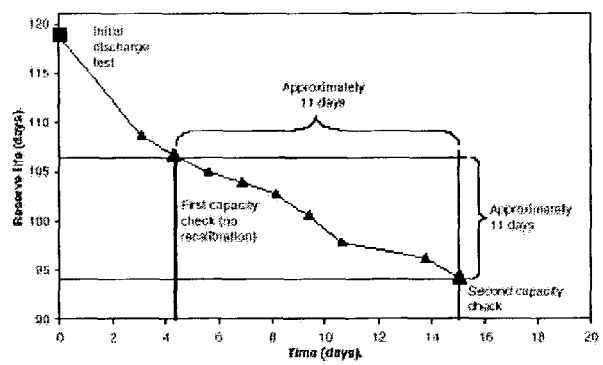
Figure 8C:
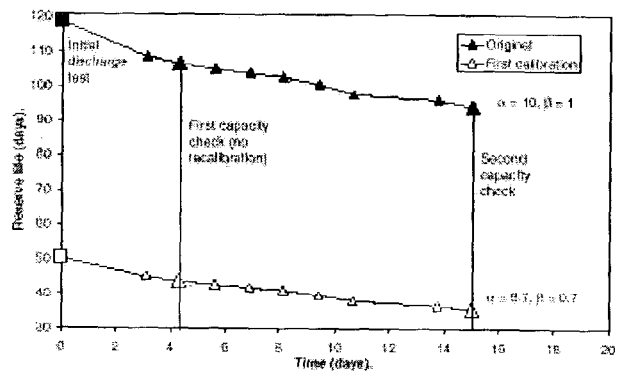

By the time for a second capacity check, both the test time and estimation of reserve life have changed by approximately 11 days, as illustrated in FIG. 8B, triggering a second capacity check. As a result of the check, the estimated reserve life determined by the trend in capacity was found to be approximately 35 days. This is much less than the approximately 94 days given by the thermal accumulation approach. Overall reserve life estimation and estimation error was calibrated (see FIG. 8C) as described above, resulting in values for α and β of 8.7 and 0.70, respectively.

Figure 8D:
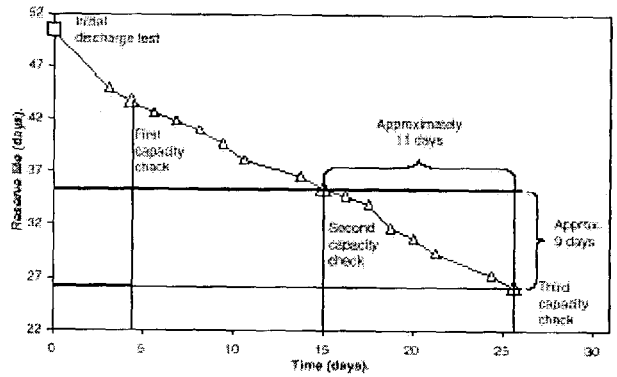

Approximately 11 days then elapsed, triggering a third capacity check. At this time, the reserve life estimation given by the calibrated thermal accumulation changed by approximately 9 days, as indicated in FIG. 8D. At this stage, the change in coup de fouet begins to reflect a change in SOH, but it has not reached its threshold. The trend in capacity provides a reserve life estimation of approximately 31 days, approximately 5 days greater than that of the thermal accumulation approach. Therefore, it is neglected.

Figure 8E:
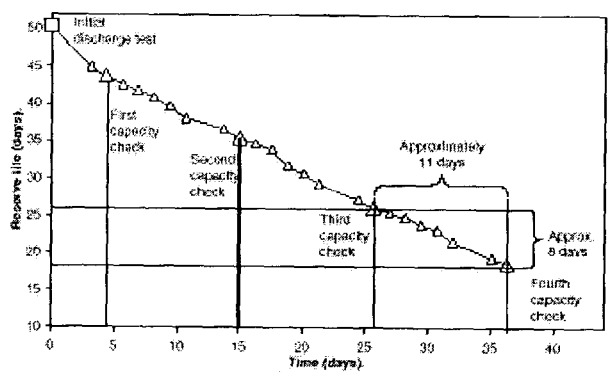
Figure 8F:
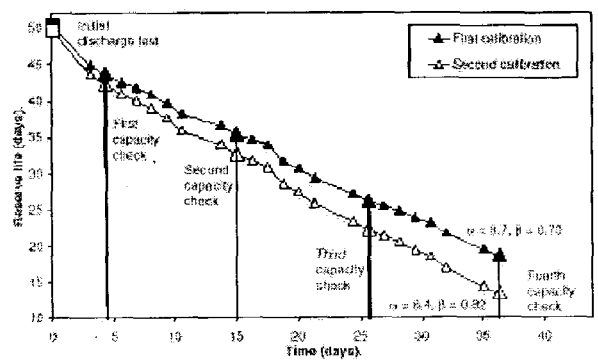

Another approximately 11 days then elapse, over which time the thermal accumulation based reserve life estimation changes by around 8 days (see FIG. 8E). The capacity check provides an estimation of reserve life based on the capacity trend of around 13 days. The thermal accumulation based reserve life estimation is much greater at approximately 19 days. Therefore, the thermal accumulation model is re-calibrated, as illustrated in FIG. 8F, resulting in values for α and β of 8.4 and 0.82, respectively.

After the forty-second day of the test, the coup de fouet SOH indicator reached its threshold of 7.5 mV/cell, as illustrated in FIG. 7. This triggered another capacity check to ensure the reserve life estimation is on track. At this stage, the reserve life given by the re-calibrated thermal accumulation model is approximately 7.9 days (equivalent to 8.3 months at 20° C.). As before, the battery capacity was estimated from a 15% DOD test discharge. The trend in capacity provides an estimation of reserve life of about 7.3 days (equivalent to 7.7 months at 20° C.), which is in relatively good agreement with the estimation obtained from the re-calibrated thermal accumulation model. In order to improve accuracy, the thermal accumulation approach is re-calibrated for a third time so that its result is identical to the estimation of reserve life obtained from the capacity trend. The new values for α and β were found to be 8.3 and 0.84, respectively.

Figure 9A:
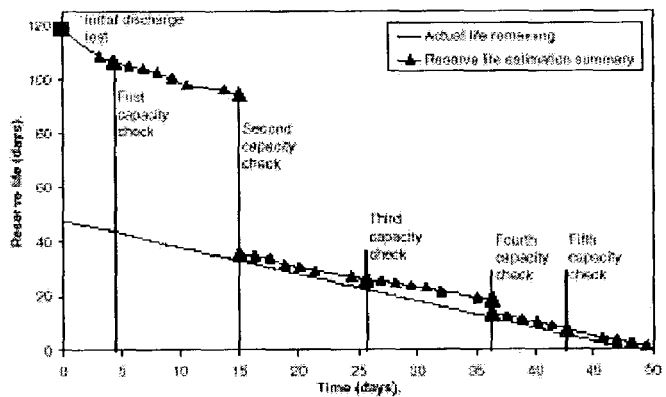
FIGS. 9A and 9B are graphs illustrating actual reserve life, estimated reserve life, and reserve life error for a battery undergoing reserve life estimation according to some embodiments of the invention.
Figure 9B:
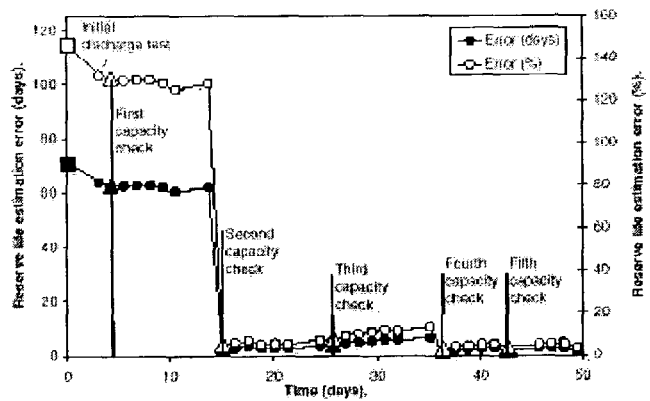

The actual reserve life is given in FIG. 9A, along with the estimated reserve life obtained using the thermal accumulation approach, re-calibrated as described above. The estimation error in days and as a percentage of the total reserve life for the test is given in FIG. 9B. This example illustrates a basic implementation of a reserve life estimation process according to some embodiments of the invention. Utilizing just two SOH indicators and five 15% DOD discharges, the reserve life was estimated to within 2.3 days, 33 days before the end of life. This corresponds to an estimation accuracy of 74 days, 1056 days from the end of life at an ambient temperature of 20° C. The error falls to 48 days 384 days from the end of life at the corresponding 20° C. ambient temperature.

It will be appreciated that many alternative implementation strategies may be used with the invention. Some of these may be difficult to illustrate using extreme thermal accelerated ageing, as the opportunity to perform tests may be limited at relatively high rates of SOH deterioration. This is the case with calibrating the change in coup de fouet parameter to the change in capacity. An alternative implementation, which can be demonstrated using the example above, is the use of the capacity trend itself to estimate reserve life. That is, rather than re-calibrate the thermal accumulation model with the estimation of reserve life obtained from the capacity trend, the estimation may be used directly and elapsed life may be deduced from it.

Figure 10A:
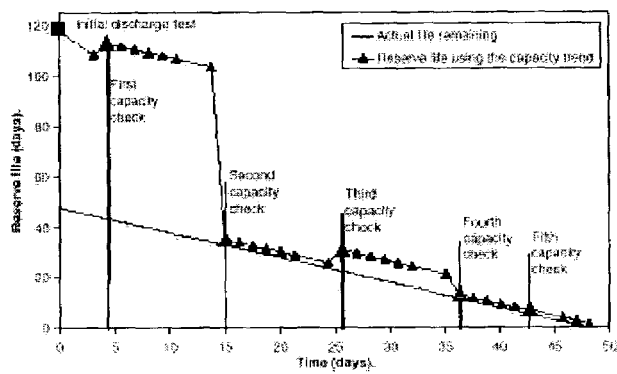
FIGS. 10A and 10B are graphs illustrating estimation of reserve life of a battery according to further embodiments of the invention.
Figure 10B:
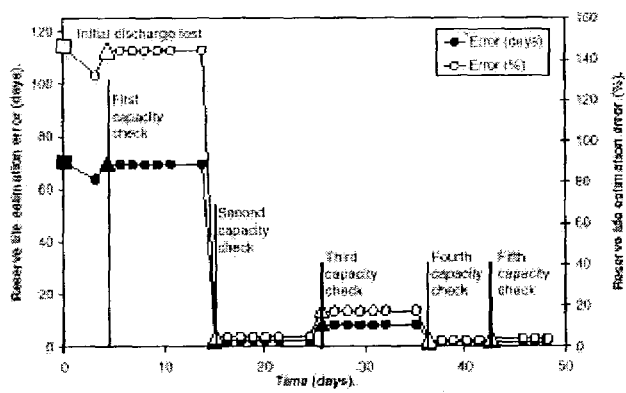

Reserve life estimation obtained by this technique is illustrated in FIG. 11A. The reserve life estimation is given by thermal accumulation up until the first capacity check only. The estimation error is illustrated in FIG. 10B. In this case, the reserve life estimation error using the capacity trend alone is greater than when it is combined with the thermal accumulation based approach.

Figure 11:
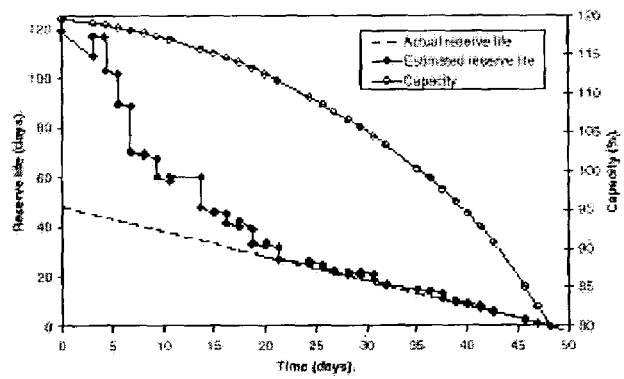
FIG. 11 is a graph illustrating estimation of reserve life of a battery according to still further embodiments of the invention

Further alternatives include increasing the frequency of the capacity checks. For instance, using the example given above, a capacity check test was performed every "year." The capacity check included a discharge to a depth of only 15%. Given such a low discharge depth, and correspondingly a low impact on the power system operational security and battery health, this capacity test could be conducted more frequently. The capacity trend data resulting from discharging every 1½ months is illustrated in FIG. 11, along with the resulting estimated reserve life.

A number of SOH indicators, or knowledge elements, which may be used with the invention have been identified. In some embodiments of the invention, these may be combined in a cooperative manner, e.g., using an expert system, to provide reliable SOH information. According to embodiments of the invention, estimation of reserve life need not be obtained by applying a fixed procedure. Instead, a dynamic test regime may be used, where the type of test is variable, as well as the period between tests.

Exemplary Implementations

Figure 12:
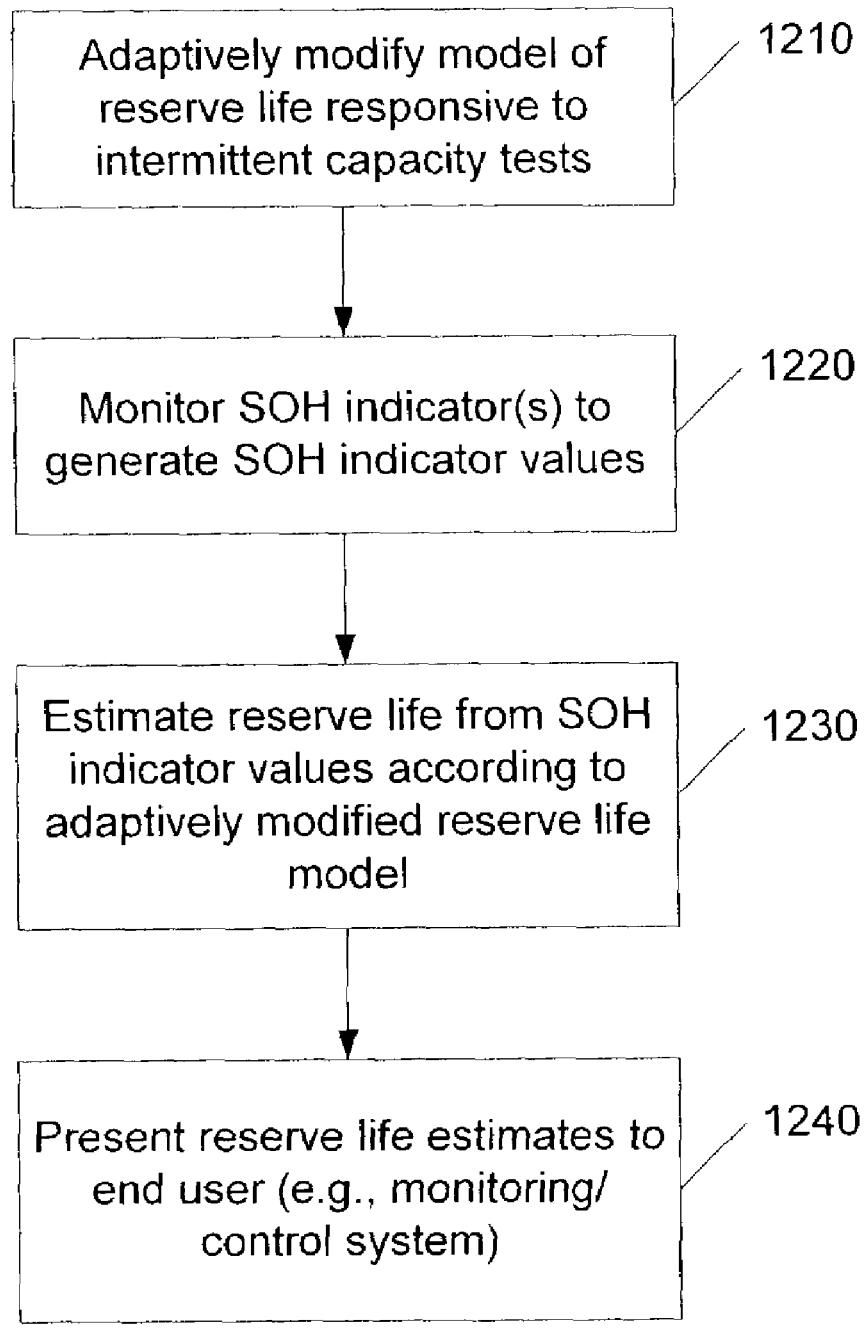
FIGS. 12–14 are flow charts illustrating battery reserve life estimation operations, apparatus and computer program products according to some embodiments of the invention.

FIG. 12 illustrates exemplary operations according to some embodiments of the invention. A battery reserve life model, e.g., a model based on one or more SOH indicators as described above, is adaptively modified responsive to intermittent capacity (e.g., discharge) tests of a battery (Block 1210). The SOH indicator(s) are monitored for the battery to generate SOH indicator values (Block 1220), which are used in the adaptively modified reserve life model to generate reserve life estimates (Block 1230). The reserve life estimates may be presented to a user of such estimates, such as a battery monitoring or control system (Block 1240). For example, the reserve life estimates may be used to generate alarms or advisories for maintenance purposes and/or to provide data for control of a power system of which the battery is a part.

It will be appreciated that the operations illustrated in FIG. 12 may be implemented in a number of different ways within the scope of the invention. For example, a variety of different SOH-indicator-based reserve life models may be used. The particular model employed may be changed as the battery progresses through different portions of its life. Capacity tests may be performed responsive to changes in estimated reserve life and/or according to a predetermined repeating pattern. Initialization of the model may be performed in any of a number of ways.

Figure 13:
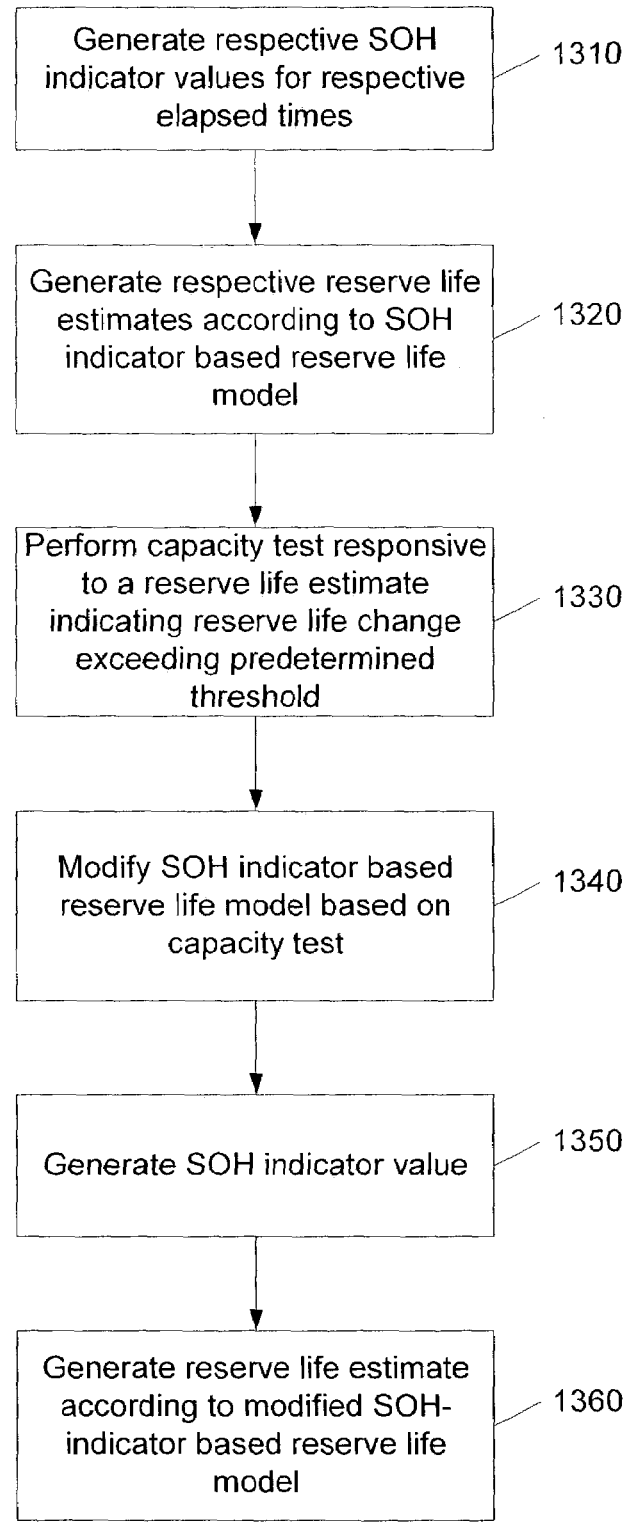

FIG. 13 illustrates exemplary operations according to further embodiments of the invention. Respective SOH indicator values are generated for respective elapsed times (Block 1310), and respective reserve life estimates are generated from the SOH indicator values according to a SOH-indicator-based reserve life model A (Block 1320). A capacity test is performed responsive to a reserve life estimate indicating a change in reserve life that meets a predetermined criterion, e.g., exceeding a predetermined threshold (Block 1330). The SOH-indicator-based reserve life model is then modified responsive to the capacity test, e.g., by equating a reserve life estimate as expressed according to the SOH-indicator-based model with a reserve life estimate generated using a capacity trend model to determine modified parameters for the SOH-indicator-based model (Block 1340). An SOH indicator value is then subsequently generated (Block 1350), and a reserve life estimate is generated from the SOH indicator value according to the modified SOH-indicator-based reserve life model (Block 1360).

Figure 14:
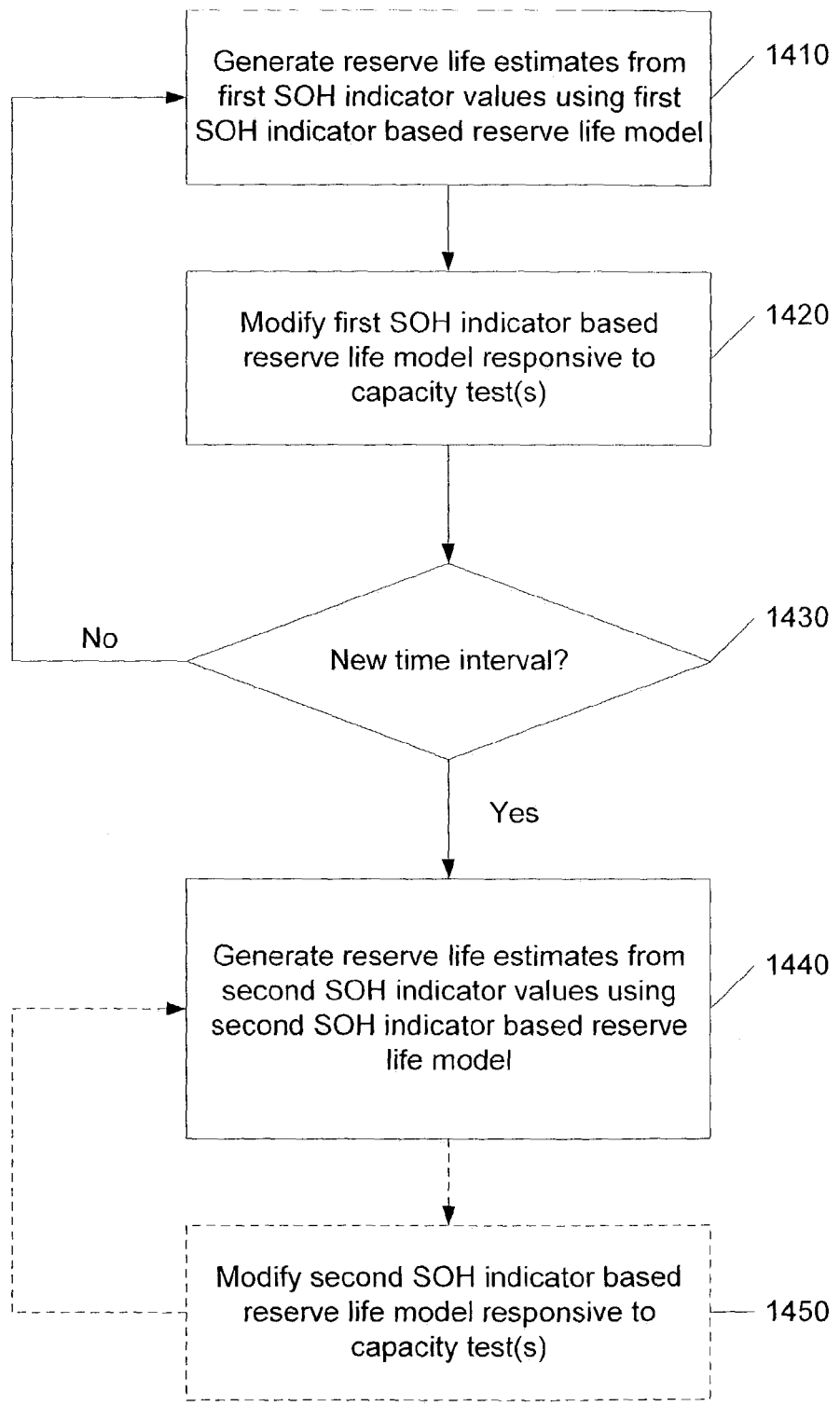

FIG. 14 illustrates exemplary operations for estimating reserve life of a battery according to further aspects of the invention. During a first time interval, e.g., during an initial portion of the battery's life, reserve life estimates are generated from first SOH indicator values (e.g., cumulative temperature information) using a first SOH-indicator-based reserve life model (Block 1410). The first SOH-indicator-based reserve life model is adaptively modified responsive to capacity tests, which may be triggered by changes in reserve life estimates and/or by passage of predetermined time intervals and/or by other criteria (Block 1420). Once the first time interval has passed (Block 1430), reserve life estimates are generated from second SOH indicator values (e.g., coup de fouet information) according to a second SOH-indicator-based reserve life model (Block 1440). During this second interval, the second SOH-indicator-based reserve life model may be adaptively modified based on further capacity tests (Block 1450). The frequency of capacity tests may differ from that occurring during the first interval.

Figure 15:
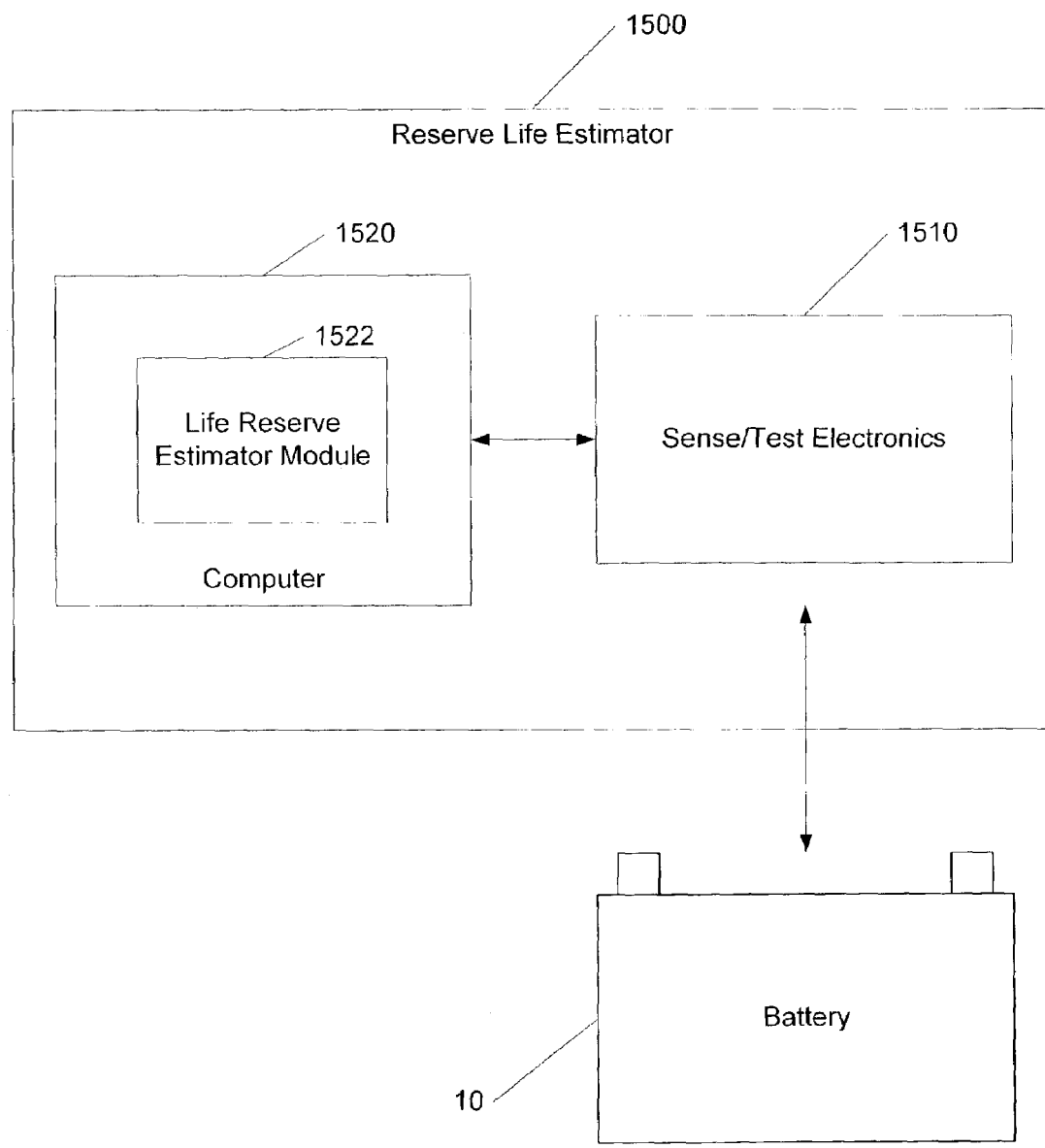
FIG. 15 is a schematic diagram illustrating an exemplary apparatus for battery reserve life estimation according to further embodiments of the invention.

FIG. 15 illustrates an exemplary apparatus for battery reserve life estimation according to further embodiments of the invention. As shown, the apparatus (1500) includes a data processor, such as a computer 1520, and sense/test electronics 1510 configured to interface the computer 1520 to a battery 10. In the illustrated embodiment, a reserve life estimator module 1522 is resident at the computer and is operative, for example, to perform the battery reserve life estimation operations described above, including the computation of reserve life estimates and model parameters and the initiation and control of capacity tests conducted in cooperation with the sense/test electronics, which may include, for example, switches that couple a load to the battery 10 and circuits that measure parameters, such as current and voltage, used in capacity tests. The computer 1520 may also be configured to provide ancillary functions, such as presentation, communication and/or further processing of the reserve life estimates for control and/or monitoring purposes.

It will be appreciated that the apparatus illustrated in FIG. 15 is provided for illustrative purposes, and that the invention may be embodied in any of a number of different ways. For example, the battery 10 could be a cell, a monobloc, a group of battery units string) or a multiple string battery system. The data processing unit (e.g., the computer 1520) could be a single computer, a distributed processing system comprising a plurality of computers, and/or a microprocessor, microcontroller, digital signal processor, or similar device embedded in system, such as a power control, industrial control or network management system. It will also be appreciated that the data processor (e.g., the computer 1520) and electronics for interfacing the data processor to a battery (e.g., the sense/test electronics 1510 of FIG. 15) may be integrated in one or more hybrid circuits, application specific integrated circuits (ASICs), or similar integrated electronics systems. It will be understood that, in general, the type of battery SOH monitoring, life reserve modeling, and capacity testing operations performed by such circuitry may be tailored to the capabilities and/or limitations of the circuit components.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed:

1. A method of estimating reserve life for a battery, the method comprising:
    adaptively modifying a model of battery reserve life that is a function of a SOH indicator responsive to intermittent capacity tests of the battery;
    monitoring the SOH indicator for the battery to generate SOH indicator values; and
    generating estimates of reserve life from the generated SOH indicator values according to the adaptively modified model of battery reserve life,
    wherein the adaptively modified model of battery reserve life comprises a first adaptively modified model of battery reserve life;
    wherein monitoring the SOH indicator to generate SOH indicator values comprises monitoring a first SOH indicator during a first time interval to generate first SOH indicator values for the first time interval;
    wherein generating estimates of reserve life from the generated SOH indicator values according to the adaptively modified model of battery reserve life comprises generating estimates of reserve life for the first time interval from the generated first SOH indicator values for the first time interval; and
    wherein the method further comprises:
        monitoring a second SOH indicator to generate second SOH indicator values for a second time interval; and
        generating estimates of reserve life from the generated second SOH indicator values according to a second model of battery reserve life.

2. A method according to claim 1, wherein generating estimates of reserve life from the generated second SOH indicator values comprises adaptively modifying the second model of battery reserve life at a reduced rate with respect to the first model of battery reserve life.

3. A method of estimating reserve life of a battery, the method comprising:
    generating respective first state of health (SOH) indicator values for respective elapsed times for the battery;
    generating respective first estimates of reserve life from the first SOH indicator values according to a battery reserve life model;
    performing a capacity test of the battery to generate a second estimate of reserve life responsive to one of the first estimates of reserve life indicating a change in reserve life exceeding a predetermined threshold;
    modifying the battery reserve life model based on the second estimate of reserve life;
    generating a second SOH indicator value; and
    generating a third estimate of reserve life from the second SOH indicator value according to the modified battery reserve life model.

4. A method according to claim 3, wherein modifying the battery reserve life model based on the second estimate of reserve life comprises modifying the battery reserve life model based on a comparison of the first and second estimates of reserve life.

5. A method according to claim 4, wherein modifying the battery reserve life model based on a comparison of the first and second estimates of reserve life comprises modifying the battery reserve life model if the second estimate of reserve life indicates a diminished reserve life of the battery in comparison to the first estimate of reserve life.

6. A method according to claim 4, wherein modifying the battery reserve life model based on a comparison of the first and second estimates of reserve life comprises generating a solution for a parameter of the battery reserve life model from the battery model and the second estimate of reserve life to generate a modified parameter for the battery model.

7. A method according to claim 4, wherein monitoring a state of health (SOH) indicator for the battery to generate a series of first SOH indicator values comprises monitoring at least one of a float voltage, a float current, a temperature, a charge/discharge cycling, an impedance, a conductance, a resistance, and a coup de fouet parameter to generate the SOH indicator values.

8. A method according to claim 7, wherein the battery reserve life model expresses battery reserve life as a function of at least one of a float voltage, a float current, a temperature, a charge/discharge cycling, an impedance, a conductance, a resistance, and a coup de fouet parameter.

9. A method according to claim 8, wherein the battery reserve life model comprises a battery reserve life model represented by the equation:

$$L_R(t_x) = f(T) = \beta \cdot \left[ \frac{L_n - \sum_{i=1}^{x}(t_i - t_{i-1}) \cdot 2^{\frac{(T_i - T_n)}{\alpha}}}{2^{\frac{(T_x - T_n)}{\alpha}}} \right],$$

wherein $L_r(t_x)$ is the estimated reserve life at time $t_x$, $T_x$ is the present temperature at time $t_x$, $L_n$ is a manufacturer's designed life at a nominal temperature $T_n$, $\alpha$ is a parameter reflecting a change in temperature that results in the life of the battery changing by a factor of two, and $\beta$ is a scaling parameter.

10. A method according to claim 3, wherein performing the capacity test responsive to one of the first estimates of reserve life indicating a change in battery reserve life exceeding a predetermined threshold comprises performing the capacity test responsive to one of the first estimates of reserve life indicating a change in reserve life with respect to a rated life of the battery that exceeds a predetermined threshold.

11. A method according to claim 3:
    wherein performing the capacity test is preceded by performing a training test to generate an initial estimate of reserve life; and wherein performing a capacity test comprises performing the capacity test responsive to one of the first estimates of reserve life indicating a change in reserve life with respect to the initial estimate of reserve life that exceeds a predetermined threshold.

12. A method according to claim 11, wherein performing a training test comprises:
   shallow discharging the battery to generate a coup de fouet parameter value; and
   generating the initial estimate of reserve life from the generated coup de fouet parameter value.

13. A method according to claim 12:
   wherein generating respective first SOH indicator values comprises generating respective first coup de fouet parameter values for respective elapsed times;
   wherein generating respective first estimates of reserve life from the first SOH indicator values according to a battery reserve life model comprise generating respective first estimates of reserve life from respective ones of the first coup de fouet parameter values;
   wherein generating a second SOH indicator value comprises generating a second coup de fouet parameter value; and
   wherein generating a third estimate of reserve life from the second SOH indicator value according to the modified battery reserve life model comprises producing the third estimate of reserve life from the generated second coup de fouet parameter value.

14. A method according to claim 4, further comprising presenting a reserve life indication to a user based on at least one of the first and third estimates of reserve life.

15. A method according to claim 14, wherein presenting a reserve life indication comprises at least one of displaying a reserve life indication and communicating a reserve life indication.

16. A method according to claim 3, wherein the battery comprises a valve-regulated lead-acid (VRLA) battery.

17. An apparatus for estimating battery reserve life, the apparatus comprising:
   means for adaptively modifying a model of battery reserve life that a function of a SOH indicator responsive to intermittent capacity tests of the battery;
   means for monitoring the SOH indicator for the battery to generate SOH indicator values; and
   means for generating estimates of reserve life from the generated SOH indicator values according to the adaptively modified model of battery reserve life,
   wherein the adaptively modified model of battery reserve life comprises a first adaptively modified model of battery reserve life;
   wherein the means for monitoring the SOH indicator to generate SOH indicator values comprises means for monitoring a first SOH indicator during a first time interval to generate first SOH indicator values for the first time interval;
   wherein the means for generating estimates of reserve life from the generated SOH indicator values according to the adaptively modified model of battery reserve life comprises means for generating estimates of reserve life for the first time interval from the generated first SOH indicator values for the first time interval; and
   wherein the means for monitoring the SOH indicator to generate SOH indicator values further comprises means for monitoring a second SOH indicator to generate second SOH indicator values for a second time interval; and
   wherein the means for generating estimates of reserve life from the generated SOH indicator values according to the adaptively modified model of battery reserve life further comprises means for generating estimates of reserve life from the generated second SOH indicator values according to a second model of battery reserve life.

18. An apparatus according to claim 17, wherein the means for generating estimates of reserve life from the generated second SOH indicator values comprises means for adaptively modifying the second model of battery reserve life at a reduced rate with respect to the first model of battery reserve life.

19. A method of estimating reserve life for a battery, the method comprising:
   adaptively modifying a model of battery reserve life that is a function of a SOH indicator responsive to intermittent capacity tests of the battery;
   monitoring the SOH indicator for the battery to generate SOH indicator values; and
   generating estimates of reserve life from the generated SOH indicator values according to the adaptively modified model of battery reserve life,
   wherein the model of battery reserve life comprises a thermal accumulation model of battery reserve life;
   wherein adaptively modifying a model of battery reserve life that is a function of a SOH indicator responsive to intermittent capacity tests of the battery comprises:
      performing a capacity test of the battery to generate a capacity estimate;
      generating an estimate of battery reserve life from a capacity trend model of reserve life; and
      modifying the thermal accumulation model of battery reserve life based on the estimate of battery reserve life generated from the capacity trend model of battery reserve life; and
   wherein generating estimates of reserve life from the generated SOH indicator values according to the adaptively modified model of battery reserve life comprises generating an estimate of reserve life according to the modified thermal accumulation model of battery reserve life.

20. A method of estimating reserve life for a battery, the method comprising:
   generating a first estimate of reserve life using a first model of battery reserve life that is a function of a SOH indicator;
   conducting a discharge test of the battery to generate a battery capacity estimate;
   generating a second estimate of reserve life from the generated battery capacity estimate using a second model of battery reserve life;
   modifying the first model of reserve life based on the second estimate of reserve life responsive to the second estimate indicating a reserve life that is less than a reserve life indicated by the first estimate; and
   generating a third estimate of reserve life using the modified first model of battery reserve life.

21. A method according to claim 20, wherein the first model of reserve life comprises a thermal accumulation model, and wherein the second model of reserve life comprises a capacity trend model.

* * * * *

UNITED STATES PATENT AND TRADEMARK OFFICE
CERTIFICATE OF CORRECTION

PATENT NO. : 7,199,557 B2
APPLICATION NO. : 10/611650
DATED : April 3, 2007
INVENTOR(S) : Adnan H. Anbuky et al.

Page 1 of 1

It is certified that error appears in the above-identified patent and that said Letters Patent is hereby corrected as shown below:

Column 14, line 50, change "$L_n$is" to -- $L_n$ is--.
Column 14, line 51, change "$T_n\alpha, \alpha$" to -- $T_n, \alpha$ --.

Signed and Sealed this

Twenty-ninth Day of May, 2007

JON W. DUDAS
*Director of the United States Patent and Trademark Office*